US009741667B2

(12) United States Patent
Zeng et al.

(10) Patent No.: US 9,741,667 B2
(45) Date of Patent: Aug. 22, 2017

(54) INTEGRATED CIRCUIT WITH DIE EDGE ASSURANCE STRUCTURE

(71) Applicant: Avago Technologies General IP (Singapore) Pte. Ltd., Singapore (SG)

(72) Inventors: Rong Zeng, Irvine, CA (US); Liming Tsau, Irvine, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/683,940

(22) Filed: Apr. 10, 2015

(65) Prior Publication Data

US 2016/0300800 A1     Oct. 13, 2016

(51) Int. Cl.
| | |
|---|---|
| *H01L 29/08* | (2006.01) |
| *H01L 23/00* | (2006.01) |
| *H01L 23/58* | (2006.01) |
| *H01L 21/66* | (2006.01) |
| *H01L 23/31* | (2006.01) |

(52) U.S. Cl.
CPC ............ *H01L 23/562* (2013.01); *H01L 22/32* (2013.01); *H01L 23/3114* (2013.01); *H01L 23/585* (2013.01)

(58) Field of Classification Search
USPC ............ 257/48, E21.521, E21.523, E21.524
See application file for complete search history.

(56) References Cited

U.S. PATENT DOCUMENTS

| | | | |
|---|---|---|---|
| 2006/0055007 A1 | 3/2006 | Yao et al. | |
| 2008/0203388 A1* | 8/2008 | He | H01L 22/32 257/48 |
| 2009/0201043 A1* | 8/2009 | Kaltalioglu | G01R 31/2858 324/750.3 |
| 2014/0124889 A1* | 5/2014 | Qian | H01L 27/14618 257/448 |

* cited by examiner

*Primary Examiner* — Timor Karimy
(74) *Attorney, Agent, or Firm* — Sterne, Kessler, Goldstein & Fox P.L.L.C.

(57) ABSTRACT

Integrated circuits with edge assurance structures are provided for more reliable and efficient monitoring of the die edge integrity using, for example, Automatic (or Automated) Test Equipment (ATE). The edge assurance structures can be used to test, for example, all (100%) of the production materials with virtually no extra cycle time and cost. The edge assurance structure can be located around an edge of the integrated circuit. The edge assurance structure can include a plurality of v-shaped structures that are connected to each other using a plurality of ultra-thick vias. The integrated circuit can include a pad that is coupled to the edge assurance structure. The pad can be used to measure a resistance of the edge assurance structure.

21 Claims, 6 Drawing Sheets

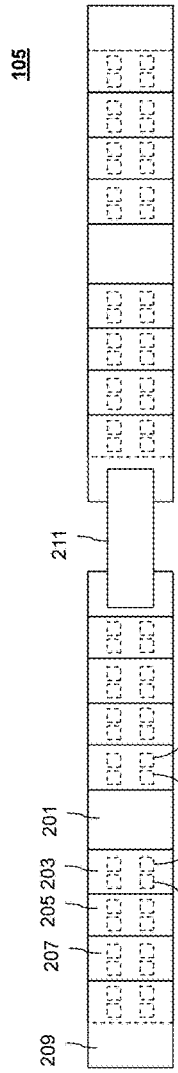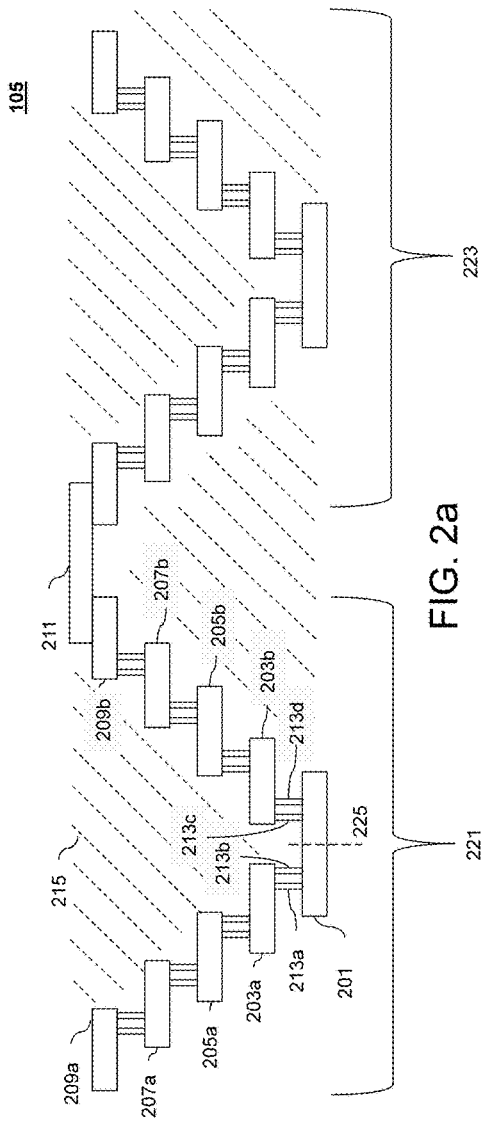

INTEGRATED CIRCUIT WITH DIE EDGE ASSURANCE STRUCTURE

BACKGROUND

Field

The present disclosure relates generally to semiconductor devices with an edge assurance structure.

Background Art

Integrated circuits ("ICs") are usually produced in large numbers on a semiconductor wafer made of silicon or other semiconductor materials. The wafer is then diced into individual die for assembly into larger circuits or systems.

Die edge delamination or cracking can result in reliability problems and yield loss, and therefore is a significant concern in the semiconductor industry. Die edge delamination or cracking can occur during the dicing of the wafer, and has been exacerbated by the introduction of ICs with low-k dielectrics in 65 nm technology node, and beyond. The use of a low-k dielectric reduces the interconnect coupling capacitance, but also reduces mechanical strength and adhesion. Die edge delamination and cracking become even more severe when using laser grooving in the dicing process, where edge chipping can be reduced at the cost of increased thermal damage to the die edges. For example, using laser to cut the wafer at high temperatures can cause metal to oxide. The metal oxidization can enlarge the volume of metal, for example, at the edges of the die. This enlarged metal oxidized layer is not strong enough and can peal or crack. The crack can further enter into the chip and cause function failure.

One way to solve this problem is to develop methods to avoid metal reside after laser grooving. But it has been difficult to develop method to clear all the metal from the wafer and between the chips. Another option is to inspect the dies and screen out the dies with delamination or cracking. Conventionally die edge delamination or cracking is screened by visual inspection and/or time-consuming and inefficient manual probing. This conventional screening method is performed on a low percentage of samples.

BRIEF DESCRIPTION OF THE DRAWINGS/FIGURES

The accompanying drawings, which are incorporated herein and form part of the specification, illustrate the present disclosure and, together with the description, further serve to explain the principles of the disclosure and to enable a person skilled in the relevant art(s) to make and use the disclosure.

FIG. 2a illustrates a cut view of a die edge assurance structure, in accordance with an embodiment of the present disclosure.

FIG. 2b illustrates a top view of a die edge assurance structure, in accordance with an embodiment of the present disclosure.

Figure 1:
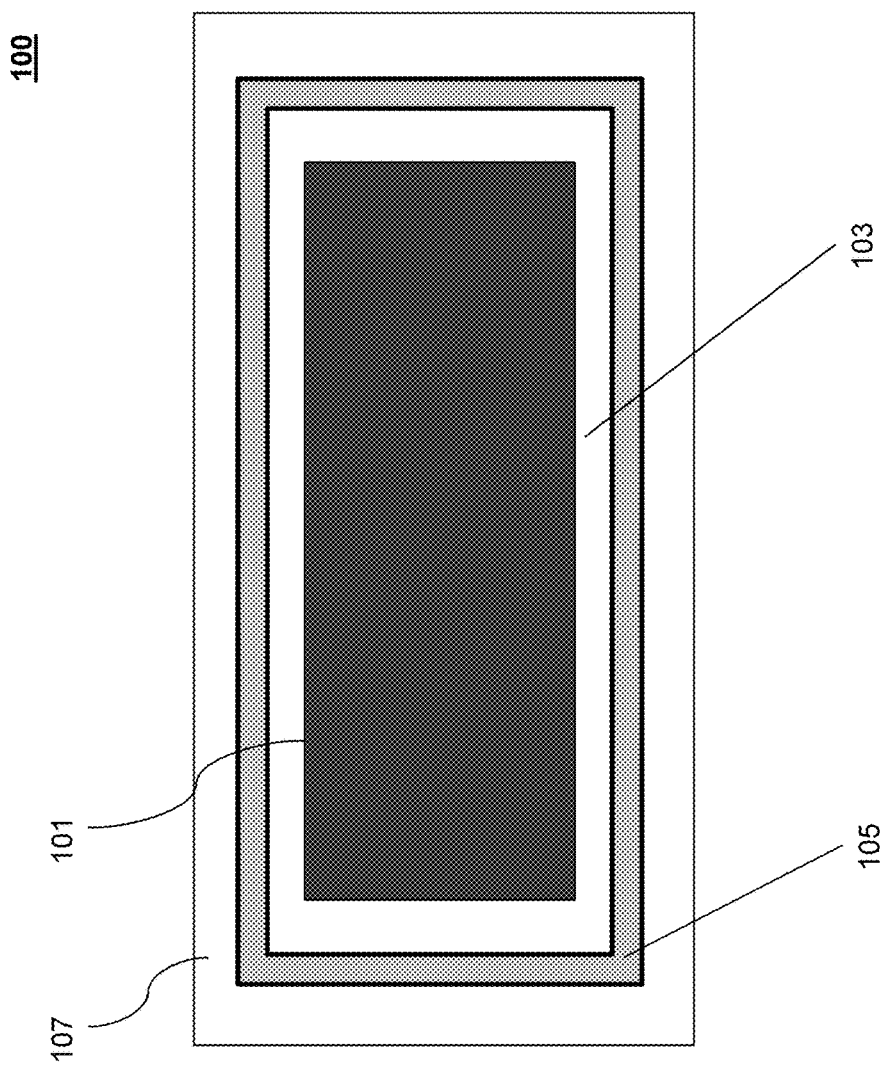
FIG. 1 illustrates the top view of a die, in accordance with an embodiment of the present disclosure.

The present disclosure will now be described with reference to the accompanying drawings. In the drawings, generally, like reference numbers indicate identical or functionally similar elements. Additionally, generally, the left-most digit(s) of a reference number identifies the drawing in which the reference number first appears.

DETAILED DESCRIPTION

Overview

Integrated circuits with edge assurance structures are provided for more reliable and efficient monitoring of die edge integrity that uses, for example, Automatic (or Automated) Test Equipment (ATE). The embodiments of this disclosure provide a die edge structure can that be used to test a large percentage, or even 100%, of the semiconductor die with virtually no additional cycle time and cost. This is in contrast to the low-percentage sampling of conventional methods, using for example visual inspection.

According to one embodiment of the disclosure, an integrated circuit includes an edge assurance structure located around an edge of the integrated circuit. The edge assurance structure is configured to be used to detect a crack on the integrated circuit. In embodiments, the edge assurance structure includes a plurality of v-shaped structures, the plurality of v-shaped structures are connected to each other using a plurality of ultra-thick vias. The integrated circuit further includes a pad coupled to the edge assurance structure. The pad is configured to be used to measure a resistance of the edge assurance structure, which can provide an indication of any delamination or cracking.

Detailed Discussion

The following Detailed Description of the present disclosure refers to the accompanying drawings that illustrate exemplary embodiments consistent with this disclosure. The exemplary embodiments will so fully reveal the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein. Therefore, the detailed description is not meant to limit the present disclosure.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

FIG. 1 illustrates the top view of a semiconductor die 100, according to an embodiment of the present disclosure. According to this example, die 100 include an integrated circuit ("IC") 101 that is surrounded by a seal ring 103. The seal ring 103 is formed around IC 101 to isolate and protect the IC electrically and/or environmentally. For example, seal ring 103 is formed to protect IC 101 from cracks that might occur on die 100. Seal ring 103 can also protect IC 101 from moisture or chemical solutions. According to one example, seal ring 103 can include a plurality of metal layers formed on top of each other and connected to each other using a plurality of vias. According to one example, seal ring 103 is formed around IC 101 simultaneously with forming IC 101. Additionally or alternatively, seal ring 103 can include the same number of layers as IC 101.

According to one embodiment, die 100 can further include die edge assurance structure 105 that is formed around seal ring 103. According to this example, die edge assurance structure 105 can be used to test die 100 for any cracks by, for example, measuring the resistance of die edge assurance structure 105. For example, if no crack breaks die edge assurance structure 105, then a very low resistance (i.e. short circuit) will be measured that is below some predetermined threshold. However, when a crack breaks down die edge assurance structure 105, an open circuit or large resistance will be measured, that is above the predetermined threshold. According to one example, die edge assurance structure 105 can include a plurality of metal layers formed on top of each other and connected to each other using a plurality of vias. According to one example, die edge assurance structure 105 is formed around IC 101 simultaneously with forming IC 101. Additionally or alternatively, die edge assurance structure 105 can include the same number of layers as IC 101. Exemplary structures of die edge assurance structure 105 are discussed with respect to FIGS. 2a, 2b, 3a, 3b, 4a, and 4b.

According to one example, die 100 can further include a crack arrest structure (or crack stop) ("CAS") 107 formed around die edge assurance structure 105. According to this example, CAS 107 can include a thick wall around die 100 to protect die 100 from cracks, peeling, etc. In one example, CAS 107 can be configured to stop cracks or peelings that might occur on its outside around the edge of die 100. According to one example, CAS 107 can include a plurality of metal layers formed on top of each other and connected to each other using a plurality of vias. According to one example, CAS 107 is formed simultaneously with forming IC 101. Additionally or alternatively, CAS 107 can include the same number of layers as IC 101.

Although FIG. 1 illustrates die edge assurance structure 105 as being formed between seal ring 103 and CAS 107, die edge assurance structure 105 can be placed within and/or incorporated in seal ring 103, CAS 107, or any other location on die 100 that is external to IC 101. The incorporation of die edge assurance structure 105 in seal ring 103 and/or CAS 107 can occur when area is a concern or in order to incorporate benefits from other adjacent protection structures.

FIG. 2a illustrates a cut view of a die edge assurance structure, in accordance with an embodiment of the present disclosure. FIG. 2b illustrates a top view of a die edge assurance structure, in accordance with an embodiment of the present disclosure. The structure of die edge assurance structure 105 as shown in FIG. 2a can be used, for example, in die 100 of FIG. 1 to improve die edge integrity.

Referring to FIG. 2a, die edge assurance structure 105 includes a plurality of v-shaped structures 221 and 223. Although only two v-shaped structures 221 and 223 are shown in FIG. 2a, any number of v-shaped structures can be used to form assurance structure 105 that runs along the edge(s) of die 100. As illustrated in FIG. 2a, the v-shaped structures 221 and 223 are connected to each other using an ultra-thick via 211.

According to one embodiment, each of the plurality of v-shaped structures 221 and 223 can include a plurality of metal layers formed on above each other and connected to each other through a plurality of vias. According to this embodiment, v-shaped structure 221 can include five metal layers. Although five metal layers are illustrated herein, it is noted that any number of layers can be used to form die edge assurance structure 105, including more or less than five. According to one example, die edge assurance structure 105 is formed simultaneously with IC 101 and can include same number of layers as IC 101. In other words, the metal layers that compose die edge assurance structure 105 are deposited at the same time as their corresponding layers in the IC 101, so as to limit any extra processing steps.

In one example, v-shaped structure 221 can include a first metal layer 201 that is formed at the bottom of die edge assurance structure 105, the bottom being the farthest metal layer from the top surface of the die 100. According to one embodiment, first metal layer 201 can have dimensions about 1.5 μm×0.5 μm, although other dimensions can be used.

According to this example, v-shaped structure 221 can further include a second metal layer 203 formed above, but separated from, first metal layer 201. Second metal layer 203 can include two portions (203a, 203b), where each portion of second metal layer 203 is displaced (or offset) from a center of first metal layer 201 (e.g., center line 225) to form the v-shaped structure 221. According to one embodiment, second metal layer 203 can have dimensions about 1 μm×0.5 μm, although other dimensions can be used.

In this example, v-shaped structure 221 can include vias 213a, 231b, 213c, and 213d (collectively vias 213). Vias 213 are formed to connect first metal layer 201 to second metal layer 203. According to one example, vias 213 are small holes inside the dielectric material 215 (that surrounds the metal layers), which are filled with metal to connect the two metal layers (e.g. 201 and 203). The vias 213 provide both a mechanical and electrical connection between the metal layers 201 and 203. Although eight vias (four vias for each portion of second layer 203) are illustrated to connect the first and second metal layers, it is appreciated that any number of vias can be used. Further the dielectric material 215 can be a low-k dielectric.

V-shaped structure 221 can also include a third metal layer 205 formed above, but separated from, second metal layer 203. Third metal layer 205 can be connected to the second metal layer 203 through a plurality of vias, similar to that described above for the connection between metal layers 201 and 203. Third metal layer 205 can include two portion (205a,205b), where each portion of third metal layer 205 is offset from the center of first metal layer 201 (e.g., center line 225) and offset from the corresponding portion of second metal layer 203 to form the v-shaped structure 221. Stated another way, the portions 203a,b of the second metal layer are offset by a first amount in a horizontal direction from the center line 225, and the portions 205a,b of the third metal layer are offset by a second amount in the horizontal direction from the center line 225, where the second amount is greater than the first amount. According to one embodiment, third metal layer 205 can have dimensions about 1 μm×0.5 μm, although other dimensions can be used.

V-shaped structure 221 can also include a fourth metal layer 207 formed above, but separated from, third metal layer 205. Fourth metal layer 207 can be connected to the third metal layer 205 through a plurality of vias. Fourth metal layer 207 can include two portions (207a, 207b), where each portion of fourth metal layer 207 is offset from a center of first metal layer 201, and corresponding portions of second metal layer 203 and third metal layer 205 to form the v-shaped structure 221. Stated another way, the portions 207a,b of the fourth metal layer are offset by a horizontal amount from the center line 225 that is greater than the corresponding horizontal amount of the third metal layer. According to one embodiment, fourth metal layer 207 can have dimensions about 1 μm×0.5 μm, although other dimensions can be used.

V-shaped structure 221 can also include a fifth metal layer 209 formed above, but separated from, fourth metal layer 207. Fifth metal layer 209 can be connected to fourth metal layer 207 through a plurality of vias. Fifth metal layer 209 can include two portions (209a, 209b), where each portion of fifth metal layer 209 is offset from a center of first metal layer 201, and corresponding portions of second metal layer 203, third metal layer 205, and fourth metal layer 207 to form the v-shaped structure 221. Stated another way, the portions 209a,b of the fifth metal layer are offset by a horizontal amount from the center line 225 that is greater than the corresponding horizontal amount of the fourth metal layer. According to one embodiment, fifth metal layer 209 can have dimensions about 1 μm×0.5 μm, although other dimensions can be used.

Although the embodiments of this disclosure are discussed with respect to five metal layers, it is noted that any number of metal layers can be included in v-shaped structure 221 of die edge assurance structure 105. According to one example, die edge assurance structure 105 is formed simultaneously with IC 101 and can include same number of layers as IC 101, so that the metal layers in die edge assurance structure 105 are deposited at the same time as the corresponding metal layers during the IC fabrication process.

As can be seen, v-shaped structure 221 includes a bottom metal layer 201 and a plurality of other metal layers each having two portions that are disposed above, but horizontally offset from, the center line of the bottom metal layer 201. As such, the individual portions of the metal layers are arranged in a "stair-step" fashion, and emanate from the bottom, or first metal layer, and continue toward the top surface of the die 100. The effect of such an arrangement is that cracks appearing from the top surface of the die 100 to the bottom metal layer 201 along the edge of the die 100, can be detected by a resistance measurement because the metal layers are connected by the vias. V-shaped structure 223 is seen to have a similar structure and that is connected to v-shaped structure 221 using the ultra-thick via 211. The v-shaped structure 221, 223 are repeated a number of times to form the die edge assurance structure 105 along the edge of die 100.

As discussed above, die edge assurance structure 105 can include an ultra-thick via (UTV) 211 to connect v-shaped structure 221 to v-shaped structure 223. According to one example, UTV 211a is a thick metal layer similar to vias (such as vias 213) but it is wide enough to make the connection between v-shaped structures 221 and 223. According to one example, UTV 211 can have dimensions about 1.72 μm×0.36 μm, although other dimensions can be used. In one embodiment, the shortest horizontal distance between the fifth metal layer of v-shaped structure 221 and the fifth metal layer of v-shaped structure 223 can be approximately 1 μm, although other dimensions can be used.

As discussed, die edge assurance structure 105 includes one or more v-shaped structures, and can be used to test die 100 for any cracks, by measuring the resistance of die edge assurance structure 105. For example, if no crack breaks die edge assurance structure 105, a short or very small resistance will be measured. However, when a crack breaks down die edge assurance structure 105 by, for example, breaking one or more of the metal layers and/or vias, an open circuit will be measured. In this example die edge assurance structure 105 is structured in a thin v-shaped metal-via-metal chain in order to compensate of lack of area on die 100 and also to be able to catch any small crack that might occur on the die.

The dimensions of the metal layers and/or vias discussed above are exemplary dimensions and the embodiments of this disclosure are not limited to these dimensions. It is noted that the metal layers and/or vias cannot be made too small because of manufacturing limits. Also, the metal layers and/or vias cannot be made too large because if they are large small cracks may be missed and not measured. Also, it is noted that the dimensions of each metal layer can be different from other metal layer.

In one example, different materials for metal and via layers can be used during a test stages to determined which metal/via layer is the weakest and can be damaged. This information can be used later in designing and building the die edge assurance structure.

Figure 3A:
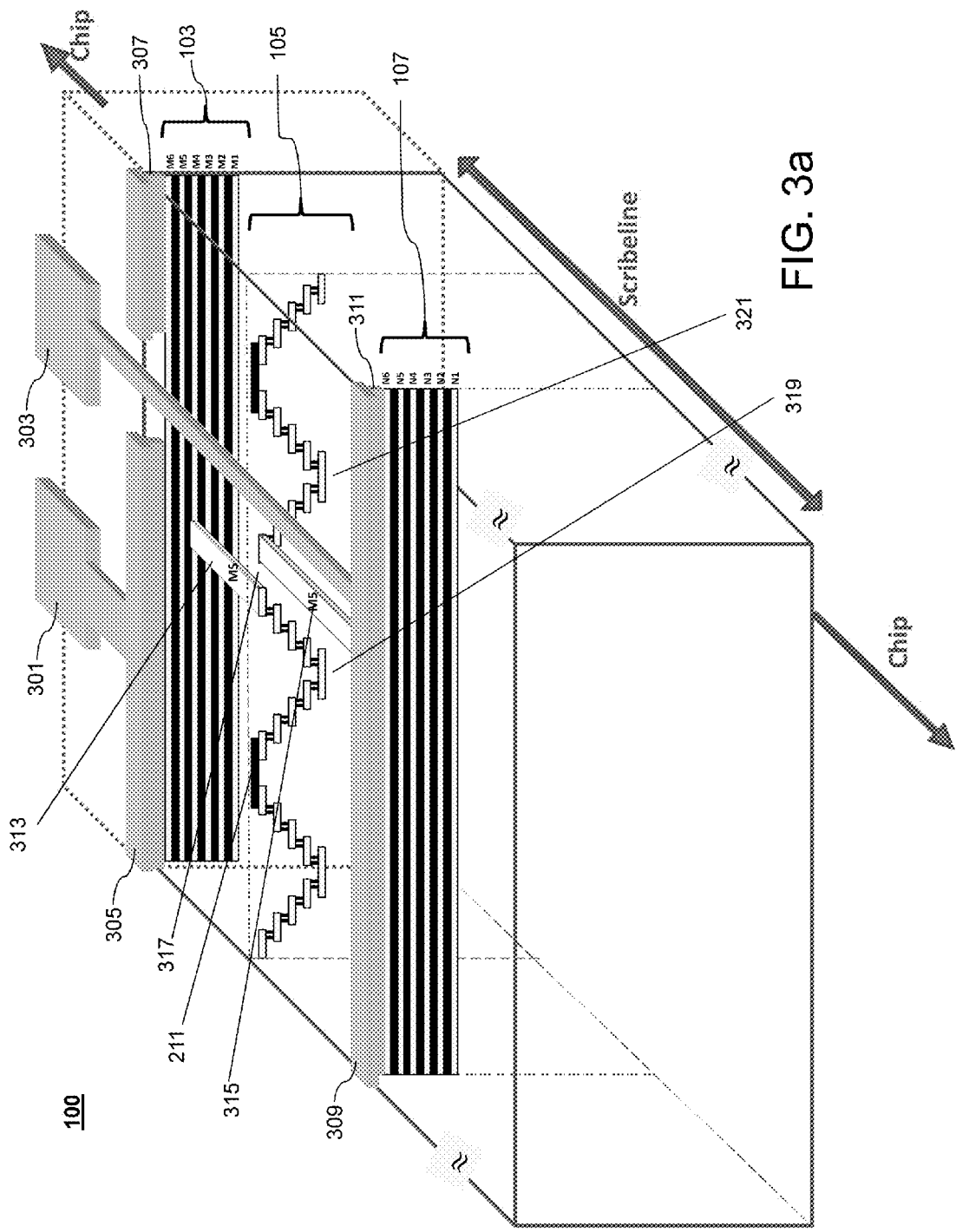
FIG. 3a illustrates a three-dimensional view of a die including a die edge assurance structure, in accordance with an embodiment of the present disclosure.
Figure 3B:
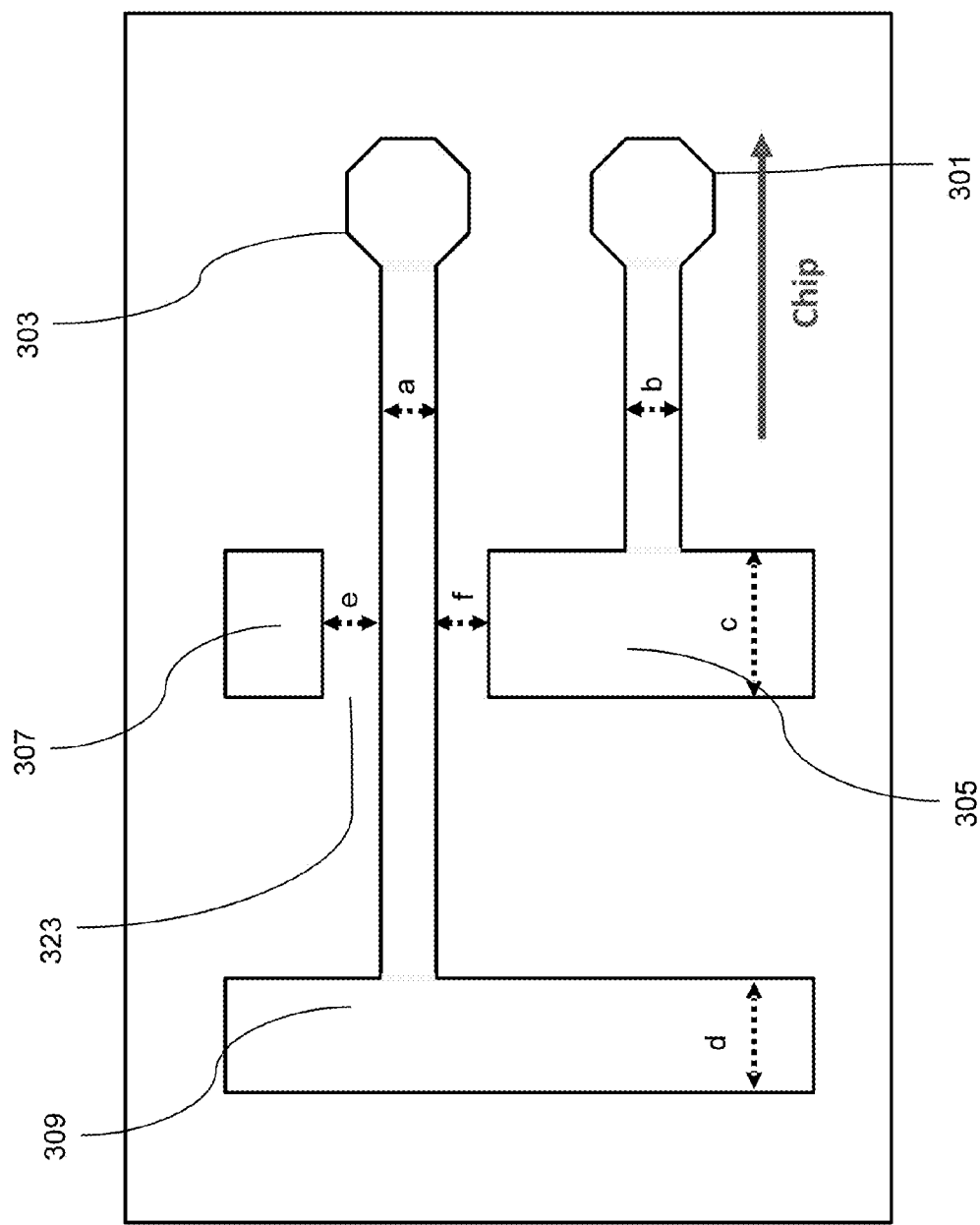
FIG. 3b illustrates a top view of the die including pads for connection to the die edge assurance structure, in accordance with an embodiment of the present disclosure.

FIG. 3a illustrates a three-dimensional view of the die 100 including a die edge assurance structure 105, in accordance with an embodiment of the present disclosure. FIG. 3b illustrates a top view of the die 100 including pads for connection to the die edge assurance structure 105, in accordance with an embodiment of the present disclosure.

FIG. 3a illustrates the die 100 in three dimensional fashion, which includes seal ring 103, die edge assurance structure 105, and CAS 107. According to this example, seal ring 103 can include five metal layers M1-M5 (illustrated as white layers in FIG. 3a) formed on top of each other and are connected to each other through vias (illustrated as black layers in FIG. 3a.) Seal ring 103 further can include a thick metal layer M6 (illustrated as a white layer in FIG. 3a) formed on top of metal layer M5 and connected to metal layer M5 through a via layer or a plurality of vias (illustrated as a black layer in FIG. 3a). Although the embodiments of this disclosure are discussed with respect to five metal layers, it is noted that any other number of metal layers can be included in seal ring 103. According to one example, seal ring 103 is formed simultaneously with IC 101 of FIG. 1 and can include same number of layers as IC 101.

According to this example, CAS 107 can also include five metal layers N1-N5 (illustrated as white layers in FIG. 3a) formed on top of each other and are connected to each other through vias (illustrated as black layers in FIG. 3a.) CAS 107 further can include a thick metal layer N6 (illustrated as a white layer in FIG. 3a) formed on top of metal layer N5 and connected to metal layer N5 through a via layer or a plurality of vias (illustrated as a black layer in FIG. 3a). Although the embodiments of this disclosure are discussed with respect to five metal layers, it is noted that other number of metal layers can be included in CAS 107. According to one example, CAS 107 is formed simultaneously with IC 101 of FIG. 1 and can include same number of layers as IC 101.

FIG. 3a is an isometric view that further illustrates an example placement of die edge assurance structure 105 within the die 100. In one example, die edge assurance structure 105 can include the structure discussed above with respect to FIGS. 2a and 2b. According to this embodiment, die edge assurance structure 105 is disposed between the seal ring 103 and the CAS 107, and can be electrically connected to seal ring 103 and/or CAS 107. According to this example, die edge assurance structure 105 can be connected to seal ring 103 through a metal layer 313 that is connected to a top-most metal layer of v-shaped structure 319. Additionally, die edge assurance structure 105 can be connected to CAS 107 through a metal layer 315 that is connected to a top-most metal layer of v-shaped structure 321. Other metal layers could be used instead the top-most metal layers of the v-shaped structures for the connections to 313,315. Connections 313 and/or 315 to seal ring 105 and/or CAS 107 enable testing of die 100 for any cracks by measuring the resistance of die edge assurance structure 105.

In one example, seal ring 103 can be connected to an aluminum layer 305, which is connected to a pad 301. According to this example, pad 301 can be used to probe the resistance of die edge assurance structure 105 through, aluminum layer 305, seal ring 103, and metal layer 313. For example, if no crack breaks die edge assurance structure 105, a short or very small resistance will be measured through pad 301. However, when a crack breaks down die edge assurance structure 105 by, for example, breaking one or more of the metal layers 201-209 and/or vias 213, an open circuit will be measured at pad 301. According to one example, aluminum layer 305 can include a layer 307 connected to seal ring 103. Additionally or alternatively, aluminum layer 307 can be part of seal ring 103. According to one example, pad 301 is located on IC 101 of FIG. 1 and a probe pin (for example, a ball pin) can be connected to pad 301 for testing die 100 for the possible cracks. Accordingly, the probing of pad 301 can be integrated with other probing on the IC 101 that are performed to test the functionality of IC 101.

Further, CAS 107 can be connected to an aluminum layer 309, which is connected to a pad 303. According to this example, pad 303 can be used to probe the resistance of die edge assurance structure 105 through aluminum layer 309, CAS 107, and metal layer 315. For example, if no crack breaks die edge assurance structure 105, a short or very small resistance will be measured through pad 303. However, when a crack breaks down die edge assurance structure 105 by, for example, breaking one or more of the metal layers 201-209 and/or vias 213, an open circuit will be measured at pad 303. According to one example, aluminum layer 309 can include a layer 311 connected to CAS 107. Additionally or alternatively, aluminum layer 311 can be part of CAS 107. According to one example, pad 303 is located on IC 101 of FIG. 1 and a probe pin (for example, a ball pin) can be connected to pad 303 for testing die 100 for the possible cracks.

More specifically, the resistance can be probed across the IC pads 301 and 303 (i.e. one probe pin on IC pad 301 and a second probe pin on IC pad 303) because the edge assurance structure 105 includes a gap 317 between two adjacent v-shaped structures 319 and 321, where there is no ultra-thick via 211 at the gap 317 as shown. This provides a tap point to measure the resistance of the plurality of v-shaped structures since the remainder of the v-shaped structures are connected together by the corresponding ultra-thick vias 211. In other words, there is a break in the chain of v-shaped structures to afford the resistance measurement. As shown, IC pad 301 is connected to the top metal layer (e.g. 209) of one v-shaped structure 319 located on one side of the gap 317, and IC pad 303 is connected to a top metal layer (e.g. 209) of the second v-shaped structure 321 located on the other side of the gap 317, As indicated above, a relatively low resistance measurement (or short) would indicate that the chain of v-shaped structures is intact and therefore no cracking, whereas a high resistance (or open) would indicate one or more cracks in the semiconductor die that severed at least one metal layer of one or more v-shaped structures.

FIG. 3b illustrates a top view of the die including pads for connection to the die edge assurance structure, in accordance with an embodiment of the present disclosure. As illustrated in FIG. 3b, pad 301 is connected to aluminum layer 305 for connection to die edge assurance structure 105 through seal ring 103. Pad 303 is connected to aluminum layer 309 for connection to die edge assurance structure 105 through CAS 107. As shown in FIG. 3b, the aluminum layer 305 includes a cut channel 323 such that pad 303 can be connected to aluminum layer 309.

According to one example, the aluminum layer that connects pad 301 to aluminum layer 305 can have a width "b" of approximately 2 µm. In one example, aluminum layer 305 can has a width "c" of approximately 5 µm. In one example, aluminum layer 309 can has a width "d" of approximately 4 µm and the aluminum layer that connects pad 303 to aluminum layer 309 can have a width "a" of approximately 2 µm. In one example, cut channel 323 can have a width of approximately 6 µm as the sum of "e"=2 µm, "a"=2 µm, and "f"=2 µm. It is noted that these measurements are exemplary measurements and other widths can also be used.

Pads 301 and 303 can have different shapes. For example, as shown in FIG. 3b, pads 301 and 303 can be eight-sided shapes. However, pads 301 and 303 can include other shapes, including square or round pads.

Figure 4A:
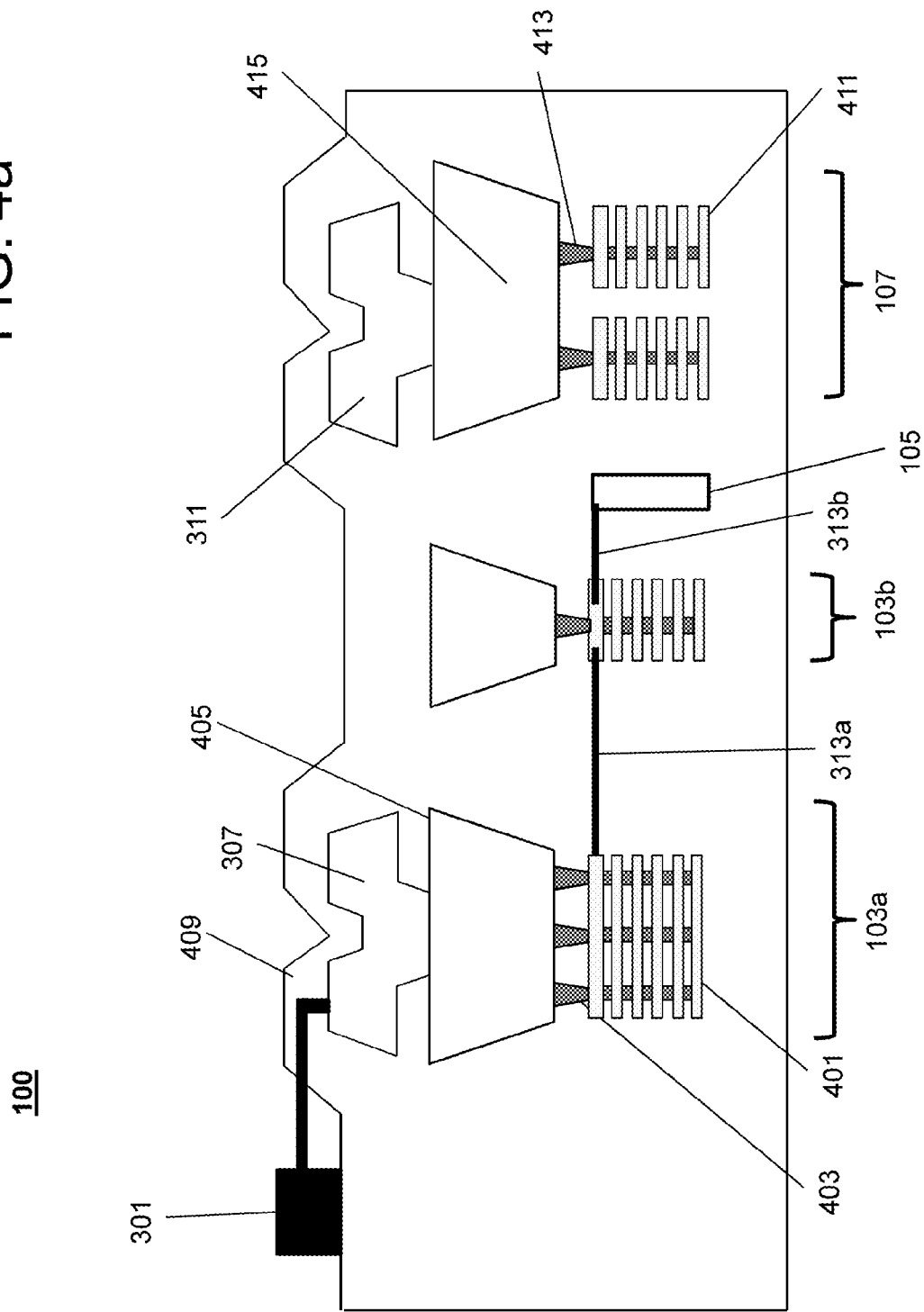
FIGS. 4a and 4b illustrate a cut view of a die including the die edge assurance structure, in accordance with an embodiment of the present disclosure.
Figure 4B:
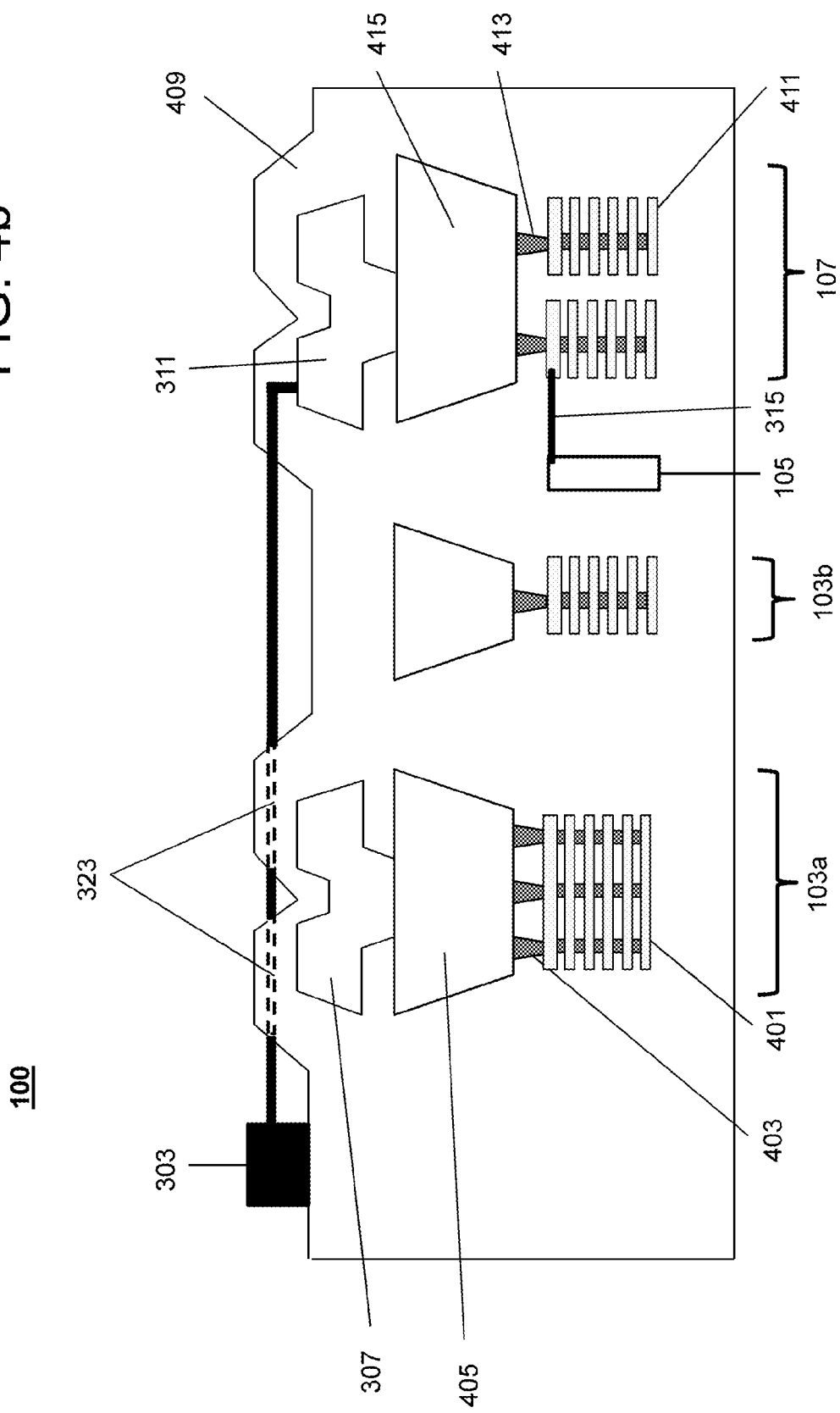

FIGS. 4a and 4b illustrate another cut view of a die 100 including the die edge assurance structure 105, in accordance with an embodiment of the present disclosure.

According to the example of FIG. 4a, a first seal ring 103a can include a plurality of metal layers and vias 401, a plurality of ultra-thick vias 403, and a thick metal layer 405. First seal ring 103a can further include an aluminum layer 307. Additionally or alternatively, aluminum layer 307 is not part of first seal ring 103a, but it is connected to first seal ring 103a. Die 100 can further include a passivation layer 409 that that provides insulation and protection for die 100. According to one example, passivation layer 409 can also protect oxidization of, for example, aluminum layer 307.

Additionally or alternatively, die 100 can include a second seal ring 103b that, similar to first seal ring 103a, can include a plurality of metal layers and vias, one (or more) ultra-thick vias 403, and a thick metal layer 405. According to this example, die edge assurance structure 105 is connected to second seal ring 103b through a metal layer 313b that passes through passivation layer 409. The second seal ring 103b can be coupled to first seal ring 103a through a metal layer 313a.

As illustrated in FIG. 4a, die 100 can also include CAS 107, which includes a plurality of metal layers and vias 411, a plurality of vias 413, and a thick metal layer 415. CAS 107 can include an aluminum layer 311. Additionally or alternatively, aluminum layer 311 is not part of CAS 107, but it is connected to CAS 107. As shown in FIG. 4b, die edge assurance structure 105 can be connected to CAS 107 through a metal layer 315 that passes through the passivation layer 409. Accordingly, die edge assurance structure 105 is connected to pad 303 through, CAS 107, and metal layer 315. Die 100 as illustrated in FIG. 4b can include a cut channel 323 such that pad 303 can be connected to CAS 107 without any connection to seal ring(s) 103. As discussed above, both pads 301 and 303 can be used for resistance testing of the die edge assurance structure 105 for crack detection.

The exemplary embodiments described herein are provided for illustrative purposes, and are not limiting. Other exemplary embodiments are possible, and modifications may be made to the exemplary embodiments within the spirit and scope of the disclosure.

It is to be appreciated that the Detailed Description section, and not the Abstract section, is intended to be used to interpret the claims. The Abstract section may set forth one or more, but not all exemplary embodiments, of the disclosure, and thus, are not intended to limit the disclosure and the appended claims in any way.

The disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the disclosure. Thus the disclosure should not be limited by any of the above-described exemplary embodiments. Further, the claims should be defined only in accordance with their recitations and their equivalents.

What is claimed is:

1. A semiconductor die, comprising:
    an integrated circuit (IC); and
    an edge assurance structure arranged around an edge of the integrated circuit, the edge assurance structure having a plurality of v-shaped structures configured to detect an existence of a crack in the semiconductor die,
    wherein the edge assurance structure includes a gap between a first v-shaped structure and a second v-shaped structure of the plurality of v-shaped structures so that the first and second v-shaped structures are electrically isolated from each other to enable resistance testing of the edge assurance structure to detect the existence of a crack in the semiconductor die, and
    wherein the IC includes a first IC pad and a second IC pad, the first IC pad electrically connected to a metal layer of the first v-shaped structure and the second IC pad electrically connected to a metal layer of the second v-shaped structure; and
    an additional metal layer that electrically connects the edge assurance structure to a seal ring that surrounds the IC.

2. The semiconductor die of claim 1, wherein each v-shaped structure comprises:
    a plurality of metal layers disposed above each other in an incremental manner and separated by dielectric material; and
    a plurality of vias connecting adjacent metal layers of the plurality of metal layers.

3. The semiconductor die of claim 1, wherein each v-shaped structure comprises:
    a first metal layer; and
    a plurality of other metal layers disposed above the first metal layer and incrementally disposed above one another in a stair-step manner, the plurality of other metal layers separated from the first metal layer and one another by dielectric material,
    wherein at least one of the plurality of other metal layers comprises two portions, each portion laterally offset from a center line of the first metal layer and an adjacent metal layer directly underneath the each portion.

4. The semiconductor die of claim 1, wherein each v-shaped structure comprises:
    a first metal layer; and
    a plurality of other metal layers disposed above the first metal layer and incrementally disposed above one another in a stair-step manner, the plurality of other metal layers separated from the first metal layer and one another by dielectric material,
    wherein first portions of the plurality of other metal layers are laterally offset in a first direction from a center line of the first metal layer, and wherein the first direction is perpendicular to a second direction defined by the center line of the first metal layer.

5. The semiconductor die of claim 4, wherein at least one first portion of the plurality of other metal layers is laterally offset in the first direction from a corresponding first portion of an adjacent metal layer of the plurality of other metal layers that is directly underneath the at least one first portion.

6. The semiconductor die of claim 1, wherein the first v-shaped structure is coupled to a third v-shaped structure of the plurality of v-shaped structures using an ultra-thick via, wherein the ultra-thick via connects a top-most metal layer of the first v-shaped structure to a top-most metal layer of the third v-shaped structure.

7. The semiconductor die of claim 1, wherein the first v-shaped structure comprises:
    a first metal layer formed at a bottom of the first v-shaped structure;
    a second metal layer disposed above the first metal layer and having first and second portions laterally offset away from a center line of the first metal layer; and
    a third metal layer disposed above the second metal layer and having first and second portions laterally offset relative to the respective first and second portions of the second metal layer;
    wherein the first, second, and third metal layers are separated by dielectric material, and
    wherein the first and second metal layers are connected by a first plurality of vias, and wherein the second and third metal layers are connected by a second plurality of vias.

8. The semiconductor die of claim 7, further comprising an ultra-thick via disposed to connect the third metal layer of the first v-shaped structure to a corresponding third metal layer of a third v-shaped structure.

9. The semiconductor die of claim 7, wherein the center line of the first metal layer defines a vertical direction, and wherein the first and second portions of the second metal layer are laterally offset relative to the center line of the first metal layer in a horizontal direction that is perpendicular to the vertical direction.

10. The semiconductor die of claim 1, further comprising:
    a crack arrest structure;
    wherein the edge assurance structure is formed between the seal ring and the crack arrest structure.

11. The semiconductor die of claim 1, wherein the first IC pad and the second IC pad are each configured to receive a corresponding probe pin.

12. A semiconductor die, comprising:
    an integrated circuit (IC);
    an edge assurance structure arranged around an edge of the integrated circuit, the edge assurance structure having a plurality of v-shaped structures configured to detect an existence of a crack in the semiconductor die; and a metal layer that connects the edge assurance structure to a seal ring formed around the IC, wherein the IC includes an IC pad configured to receive a probe pin, and wherein the IC pad is connected to the seal ring to enable resistance testing of the edge assurance structure.

13. The semiconductor die of claim 12, wherein the existence of a crack in the semiconductor die is detected when an open circuit is determined during the resistance testing.

14. The semiconductor die of claim 12, further comprising:

a second metal layer that connects the edge assurance structure to a crack arrest structure;

wherein the IC includes a second IC pad configured to receive a second probe pin, wherein the second IC pad is connected to the crack arrest structure to enable resistance testing of the edge assurance structure, and wherein the existence of a crack in the semiconductor die is detected when an open circuit is determined during the resistance testing.

15. A semiconductor die, comprising:

an integrated circuit (IC) including an IC pad configured to receive a probe pin;

an edge assurance structure having a plurality of v-shaped structures arranged to surround the IC, the plurality of v-shaped structures including a first v-shaped structure and a second v-shaped structure each having a plurality of metal layers, wherein a top-most metal layer of the first v-shaped structure is connected to a top-most metal layer of the second v-shaped structure by a via connection;

wherein the IC pad is connected to a metal layer of a third v-shaped structure of the plurality of v-shaped structures to enable resistance testing of the edge assurance structure and determine an existence of a crack in any of the plurality of v-shaped structures; and an additional metal layer that electrically connects the edge assurance structure to a seal ring that surrounds the IC.

16. The semiconductor die of claim 15, wherein the plurality of metal layers of the first v-shaped structure includes:

a first metal layer forming a bottom of the first v-shaped structure;

a plurality of other metal layers disposed above the first metal layer and separated from the first metal layer by dielectric material;

wherein each of the plurality of other metal layers comprises a first portion and a second portion, the first portion laterally offset from a center line of the first metal layer in a first horizontal direction, and the second portion laterally offset from the first metal layer in a second horizontal direction that is opposite of the first horizontal direction.

17. The semiconductor die of claim 16, wherein the first and second horizontal directions are perpendicular to a vertical direction defined by the center line of the first metal layer.

18. The semiconductor die of claim 16, wherein the first portion of at least one of the plurality of other metal layers is laterally offset in the first horizontal direction from a corresponding first portion of an adjacent metal layer that is directly beneath the first portion, and wherein the second portion of at least one of the plurality of metal layers is laterally offset in the second horizontal direction from a corresponding second portion of an adjacent metal layer that is directly beneath the second portion.

19. The semiconductor die of claim 18, wherein the first portion and the corresponding first portion in the adjacent metal layer are connected together by a first plurality of vias, and wherein the second portion and the corresponding second portion in the adjacent metal layer are connected together by a second plurality of vias.

20. The semiconductor die of claim 15, wherein the first v-shaped structure includes:

a first metal layer formed at a bottom of the first v-shaped structure;

a second metal layer disposed above the first metal layer and having first and second portions laterally offset away from a center line of the first metal layer by a first amount; and a third metal layer disposed above the second metal layer and having first and second portions laterally offset away from the center line of the first metal layer by a second amount that is greater than the first amount;

wherein the first, second, and third metal layers are separated by dielectric material, and wherein the first and second metal layers are connected by a first plurality of vias, and wherein the second and third metal layers are connected by a second plurality of vias.

21. The semiconductor die of claim 15, wherein the IC includes a second IC pad configured to receive a second probe pin, wherein the second IC pad is connected to a metal layer of a fourth v-shaped structure of the plurality of v-shaped structures, and wherein a gap exists between the metal layer of the third v-shaped structure and the metal layer of the fourth v-shaped structure.

* * * * *